(12) United States Patent
Lin et al.

(10) Patent No.: US 12,089,419 B2
(45) Date of Patent: Sep. 10, 2024

(54) NON-VOLATILE MEMORY DEVICE AND MANUFACTURING METHOD THEREOF

(71) Applicant: United Microelectronics Corp., Hsinchu (TW)

(72) Inventors: Cheng-Yi Lin, Yilan County (TW); Tang Chun Weng, Chiayi (TW); Chia-Chang Hsu, Kaohsiung (TW); Yung Shen Chen, Kaohsiung (TW); Chia-Hung Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 18/304,335

(22) Filed: Apr. 20, 2023

(65) Prior Publication Data

US 2023/0262993 A1 Aug. 17, 2023

Related U.S. Application Data

(63) Continuation of application No. 17/345,806, filed on Jun. 11, 2021, now Pat. No. 11,690,230.

(30) Foreign Application Priority Data

May 17, 2021 (CN) .......................... 202110532868.6

(51) Int. Cl.
| | |
|---|---|
| *H10B 61/00* | (2023.01) |
| *H01L 23/522* | (2006.01) |
| *H01L 23/528* | (2006.01) |
| *H10N 50/01* | (2023.01) |
| *H10N 50/80* | (2023.01) |

(52) U.S. Cl.
CPC .......... *H10B 61/00* (2023.02); *H01L 23/5226* (2013.01); *H01L 23/5283* (2013.01); *H10N 50/01* (2023.02); *H10N 50/80* (2023.02)

(58) Field of Classification Search
CPC ........ H10B 61/00; H10N 50/80; H10N 50/01; H01L 27/222; H01L 23/5226; H01L 23/5283; H01L 43/02; H01L 43/12
USPC ....................................................... 257/421
See application file for complete search history.

(56) References Cited

U.S. PATENT DOCUMENTS

| | | |
|---|---|---|
| 8,551,853 B2 | 10/2013 | Tsuji et al. |
| 2010/0118581 A1 | 5/2010 | Okayama |
| 2011/0069531 A1 | 3/2011 | Aburada et al. |

(Continued)

*Primary Examiner* — Tu-Tu V Ho
(74) *Attorney, Agent, or Firm* — JCIPRNET

(57) ABSTRACT

Provided are a non-volatile memory device and a manufacturing method thereof. The non-volatile memory device includes a substrate having a memory region and a dummy region surrounding the memory region, an interconnect structure, memory cells, conductive vias and dummy vias. The interconnect structure is disposed on the substrate and in the memory region. The memory cells are disposed on the interconnect structure and arranged in an array when viewed from a top view. The memory cells include first memory cells in the memory region and second memory cells in the dummy region. The conductive vias are disposed in the memory region and between the first memory cells and the interconnection structure to electrically connect each of the first memory cells to the interconnect structure. The dummy vias are disposed in the dummy region and surround the memory region.

18 Claims, 9 Drawing Sheets

(56) References Cited

U.S. PATENT DOCUMENTS

2013/0187275 A1\* 7/2013 Ohira ...................... H01L 24/03
257/762

\* cited by examiner

NON-VOLATILE MEMORY DEVICE AND MANUFACTURING METHOD THEREOF

CROSS-REFERENCE TO RELATED APPLICATION

This application is a continuation application of and claims the priority benefit of U.S. application Ser. No. 17/345,806, filed on Jun. 11, 2021, now allowed, which claims the priority benefit of China application serial no. 202110532868.6, filed on May 17, 2021. The entirety of each of the above-mentioned patent applications is hereby incorporated by reference herein and made a part of this specification.

BACKGROUND

Technical Field

The present invention relates to a semiconductor device and a manufacturing method thereof, and particularly relates to a non-volatile memory device and a manufacturing method thereof.

Description of Related Art

In the general magnetoresistive random access memory (MRAM) process, during the patterning process for forming memory cells, the optical effect may affect the profile of the memory cells located at the edge of the memory region, making the dimension of the memory cells located at the edge of the memory region smaller than the dimensions of other memory cells.

In order to avoid the above problem, currently a dummy region may be disposed around the memory region, and dummy memory cells are disposed in the dummy region. In this way, the optical effect only affects the dummy memory cells around the memory region, so that the memory cells in the memory region may have the same dimension.

In addition, in order to prevent the dummy memory cells in the dummy region from being electrically connected to other circuits and thus affecting the performance of the device, no conductive vias are disposed under the dummy memory cells. At this time, the profile of the conductive vias that are located at the edge of the memory region and used to electrically connect the memory cells to the circuit patterns may be affected by the optical effect and thus have a smaller aperture. As a result, the performance of the device is affected. For example, a conductive via with a smaller aperture may have a larger resistance, resulting in a great decrease in the tunneling magnetoresistance (TMR) of the MMRAM.

SUMMARY

The present invention provides a non-volatile memory device in which dummy vias are disposed around the memory region.

The present invention provides a manufacturing method of a non-volatile memory device, wherein dummy vias are formed around the memory region.

A non-volatile memory device of the present invention includes a substrate having a memory region and a dummy region surrounding the memory region, an interconnect structure, a plurality of memory cells, a plurality of conductive vias and a plurality of circles of dummy vias. The interconnect structure is disposed on the substrate and located in the memory region. The plurality of memory cells are disposed on the interconnect structure and arranged in an array when viewed from a top view. The plurality of memory cells include a plurality of first memory cells located in the memory region and a plurality of circles of second memory cells located in the dummy region. The plurality of conductive vias are disposed in the memory region and located between the plurality of first memory cells and the interconnection structure to electrically connect each of the first memory cells to the interconnect structure, respectively. The plurality of circles of dummy vias are disposed in the dummy region and surround the memory region. One of the plurality of circles of dummy vias is located between two adjacent circles of second memory cells, and one of the plurality of circles of dummy vias is located between the second memory cells and the first memory cells.

In an embodiment of the memory structure of the present invention, when viewed from a top view, the conductive vias in two adjacent columns are aligned with each other, and the conductive vias in two adjacent rows are aligned with each other.

In an embodiment of the memory structure of the present invention, when viewed from a top view, the plurality of circles of dummy vias are not aligned with the plurality of conductive vias in the column direction, and the plurality of circles of dummy vias are not aligned with the plurality of conductive vias in the row direction.

In an embodiment of the memory structure of the present invention, the distances between the conductive vias in two adjacent columns and between the conductive vias in two adjacent rows are smaller than the distance between the adjacent dummy via and the conductive via.

In an embodiment of the memory structure of the present invention, when viewed from a top view, the conductive vias in two adjacent columns are not aligned with each other, and the conductive vias in two adjacent rows are not aligned with each other.

In an embodiment of the memory structure of the present invention, the distances between the conductive vias in two adjacent columns and between the conductive vias in two adjacent rows are greater than the distance between the adjacent dummy via and the conductive via.

In an embodiment of the memory structure of the present invention, the interconnect structure includes dummy portions located in the dummy region, and the plurality of circles of second memory cells are not electrically connected to the dummy portions.

In an embodiment of the memory structure of the present invention, the plurality of circles of dummy vias are not connected to the dummy portions.

In an embodiment of the memory structure of the present invention, the plurality of circles of dummy vias are connected with the dummy portions.

In an embodiment of the memory structure of the present invention, the aperture of the dummy vias is smaller than the aperture of the conductive vias.

A manufacturing method of the non-volatile memory device of the present invention includes the following steps. A substrate having a memory region and a dummy region surrounding the memory region is provided. An interconnect structure is formed on the substrate, wherein the interconnect structure is located in the memory region. A plurality of memory cells are formed on the interconnect structure, wherein the plurality of memory cells are arranged in an array when viewed from a top view, and include a plurality of first memory cells located in the memory region and a plurality of circles of second memory cells located in the dummy region. A plurality of conductive vias are formed in the memory region, wherein the plurality of conductive vias are located between the plurality of first memory cells and the interconnect structure to electrically connect each of the first memory cells and the interconnect structure, respectively. A plurality of circles of dummy vias are formed in the dummy region, wherein the plurality of circles of dummy vias surround the memory region. One of the plurality of circles of dummy vias is located between two adjacent circles of second memory cells, and one of the plurality of circles of dummy vias is located between the second memory cells and the first memory cells.

In an embodiment of the manufacturing method of the non-volatile memory device of the present invention, when viewed from a top view, the conductive vias in two adjacent columns are aligned with each other, and the conductive vias in two adjacent rows are aligned with each other.

In an embodiment of the manufacturing method of the non-volatile memory device of the present invention, when viewed from a top view, the plurality of circles of dummy vias are not aligned with the plurality of conductive vias in the column direction, and the plurality of circles of dummy vias are not aligned with the plurality of conductive vias in the row direction.

In an embodiment of the manufacturing method of the non-volatile memory device of the present invention, the distances between the conductive vias in two adjacent columns and between the conductive vias in two adjacent rows are smaller than the distance between the adjacent dummy via and the conductive via.

In an embodiment of the manufacturing method of the non-volatile memory device of the present invention, when viewed from a top view, the conductive vias in two adjacent columns are not aligned with each other, and the conductive vias in two adjacent rows are not aligned with each other.

In an embodiment of the manufacturing method of the non-volatile memory device of the present invention, the distances between the conductive vias in two adjacent columns and between the conductive vias in two adjacent rows are greater than the distance between the adjacent dummy via and the conductive via.

In an embodiment of the manufacturing method of the non-volatile memory device of the present invention, the interconnect structure includes dummy portions located in the dummy region, and the plurality of circles of second memory cells are not electrically connected to the dummy portions.

In an embodiment of the manufacturing method of the non-volatile memory device of the present invention, the plurality of circles of dummy vias are not connected to the dummy portions.

In an embodiment of the manufacturing method of the non-volatile memory device of the present invention, the plurality of circles of dummy vias are connected with the dummy portions.

In an embodiment of the manufacturing method of the non-volatile memory device of the present invention, the aperture of the dummys via is smaller than the aperture of the conductive vias.

Based on the above, in the present invention, dummy vias are disposed around the memory region. Therefore, when the photolithographic process is used to define the positions of the conductive vias connected to the memory cells and the positions of the dummy vias, the profile of the photoresist pattern used to define the positions of the conductive vias surrounded by the dummy vias may be prevented from being subjected to the optical effect resulting in a smaller aperture, which may ensure the performance of the memory device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
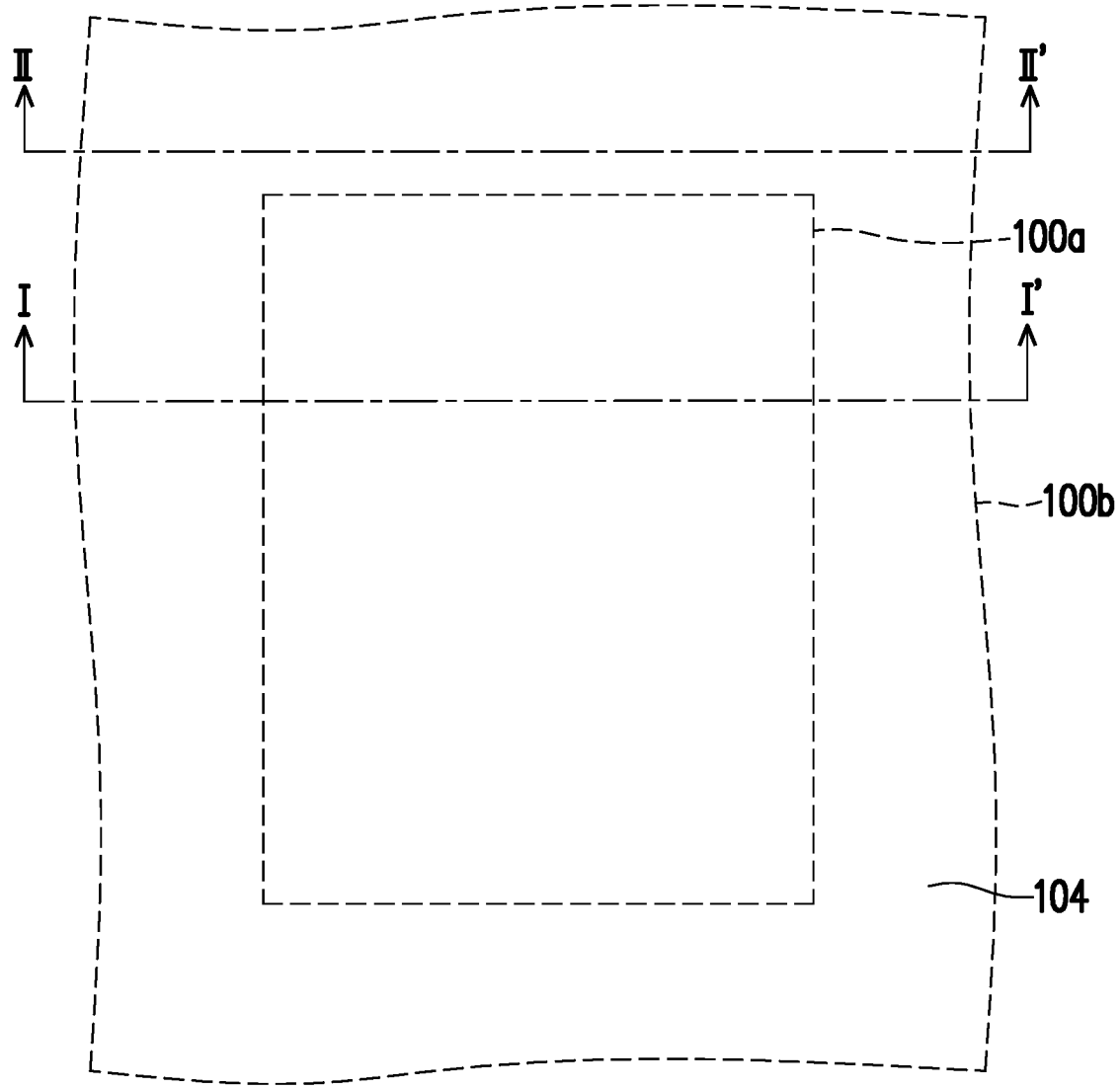
FIGS. 1A to 1C are schematic top views of a manufacturing process of a non-volatile memory device according to an embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

Figure 1B:
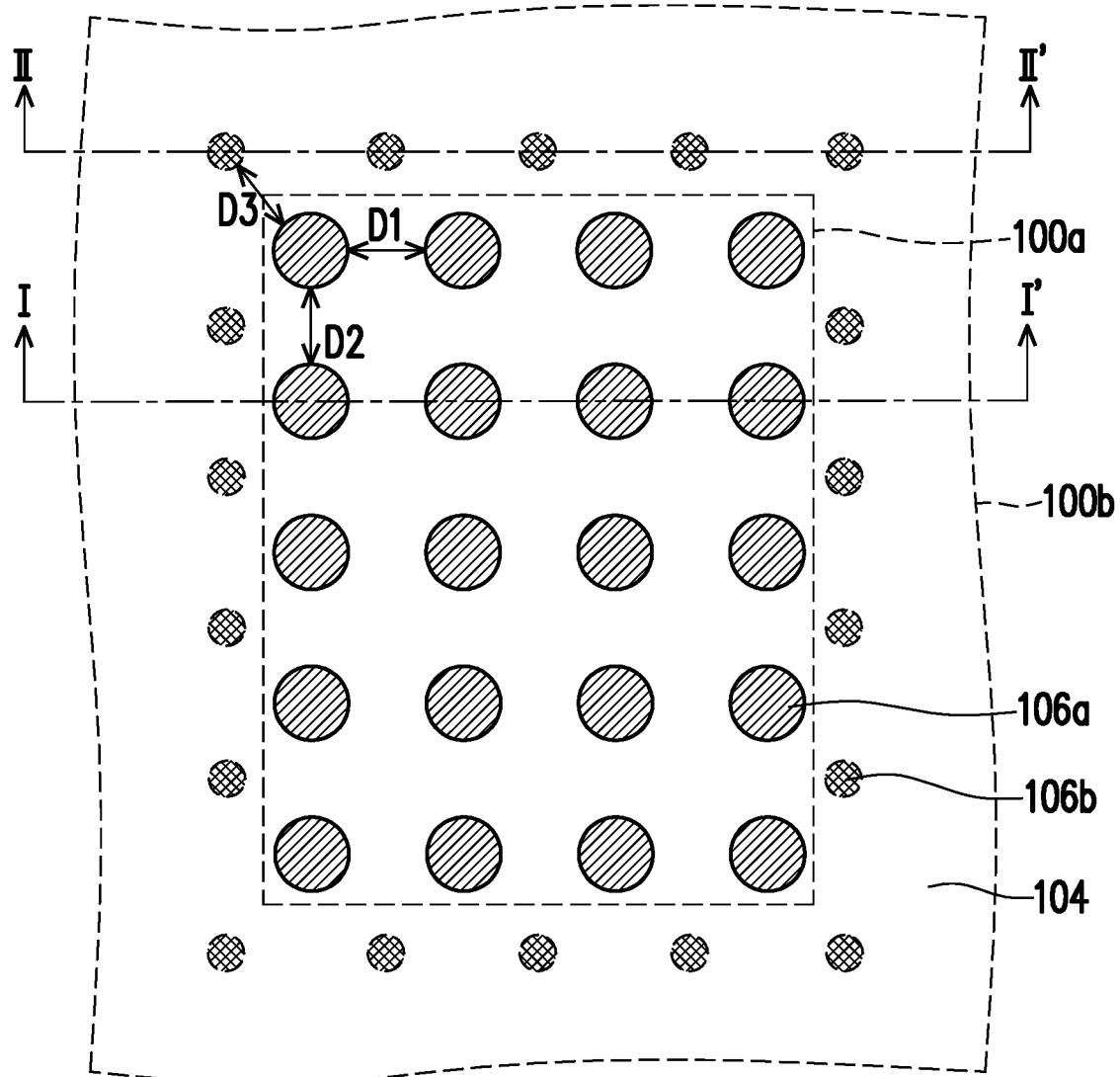
Figure 1C:
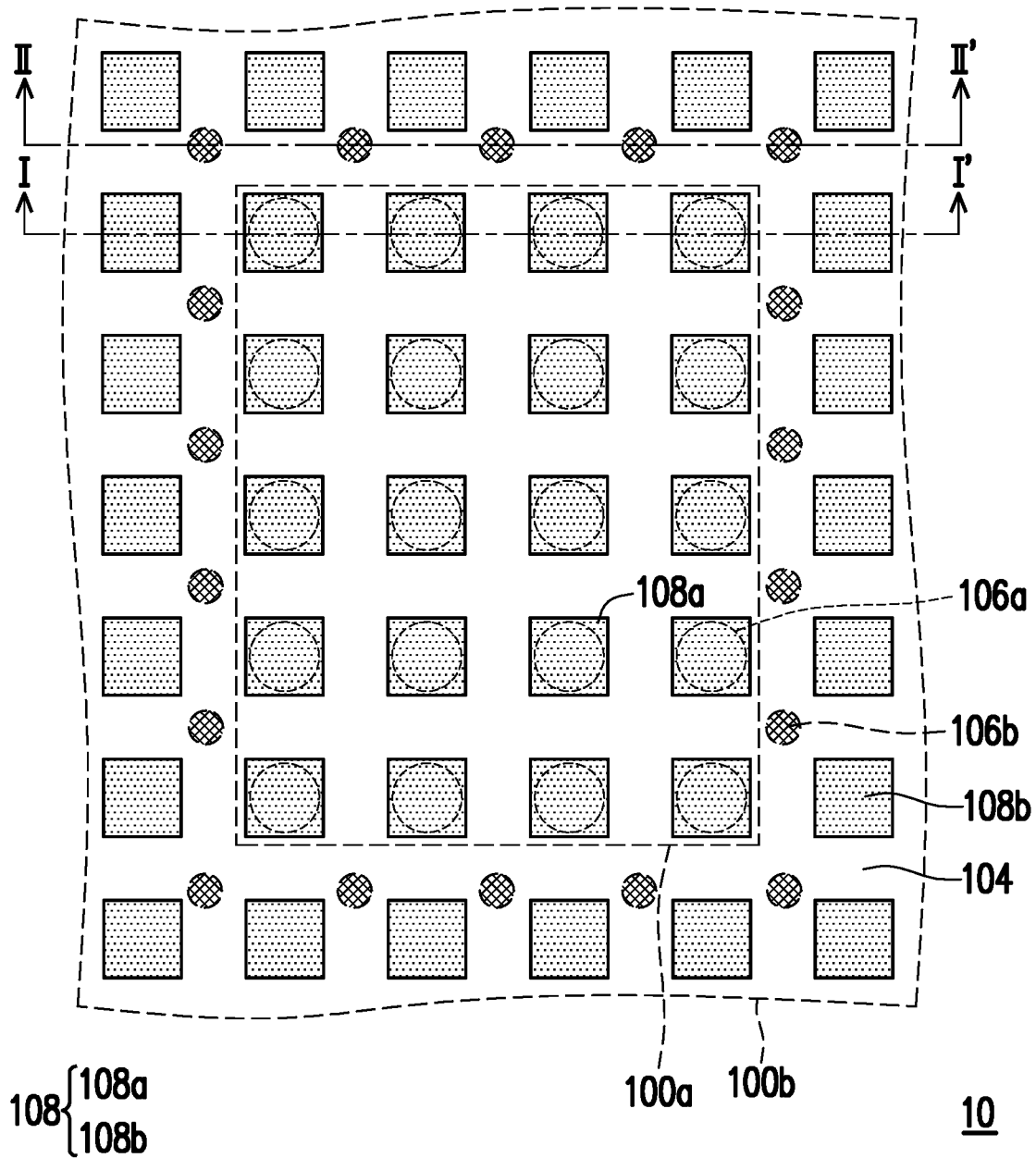
Figure 2A:
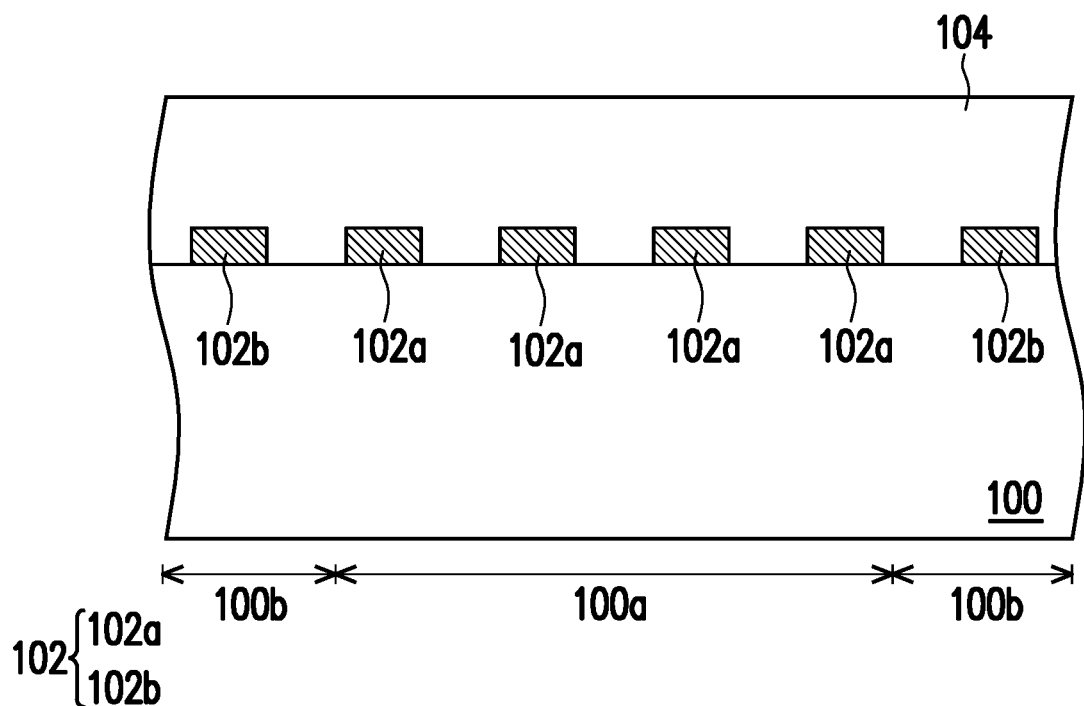
FIGS. 2A to 2C are schematic cross-sectional views of the manufacturing process according to the section line I-I' in FIGS. 1A to 1C.
Figure 2B:
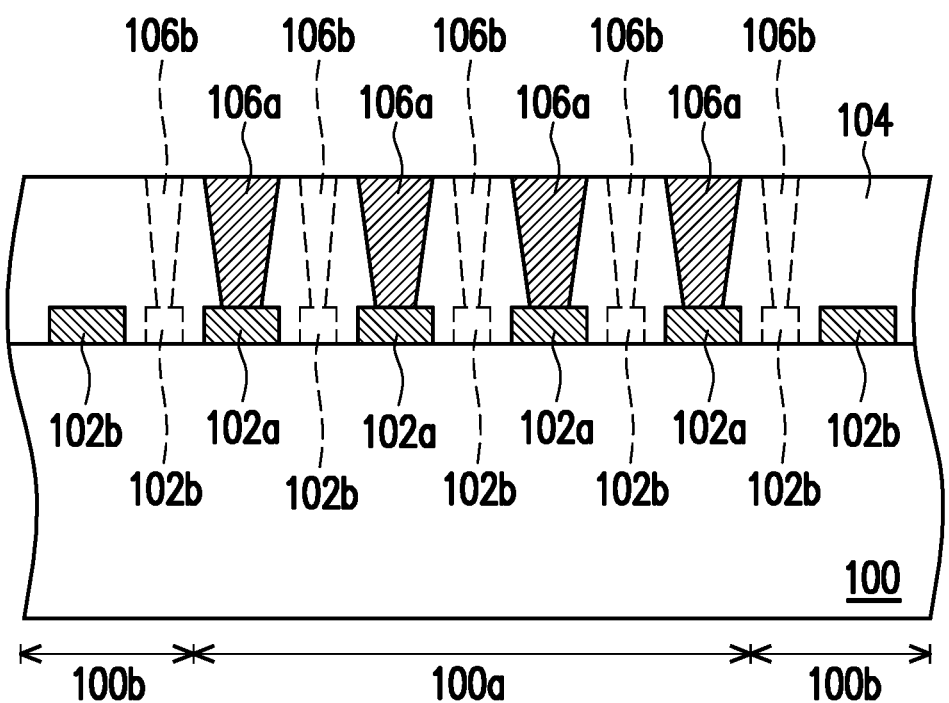
Figure 2C:
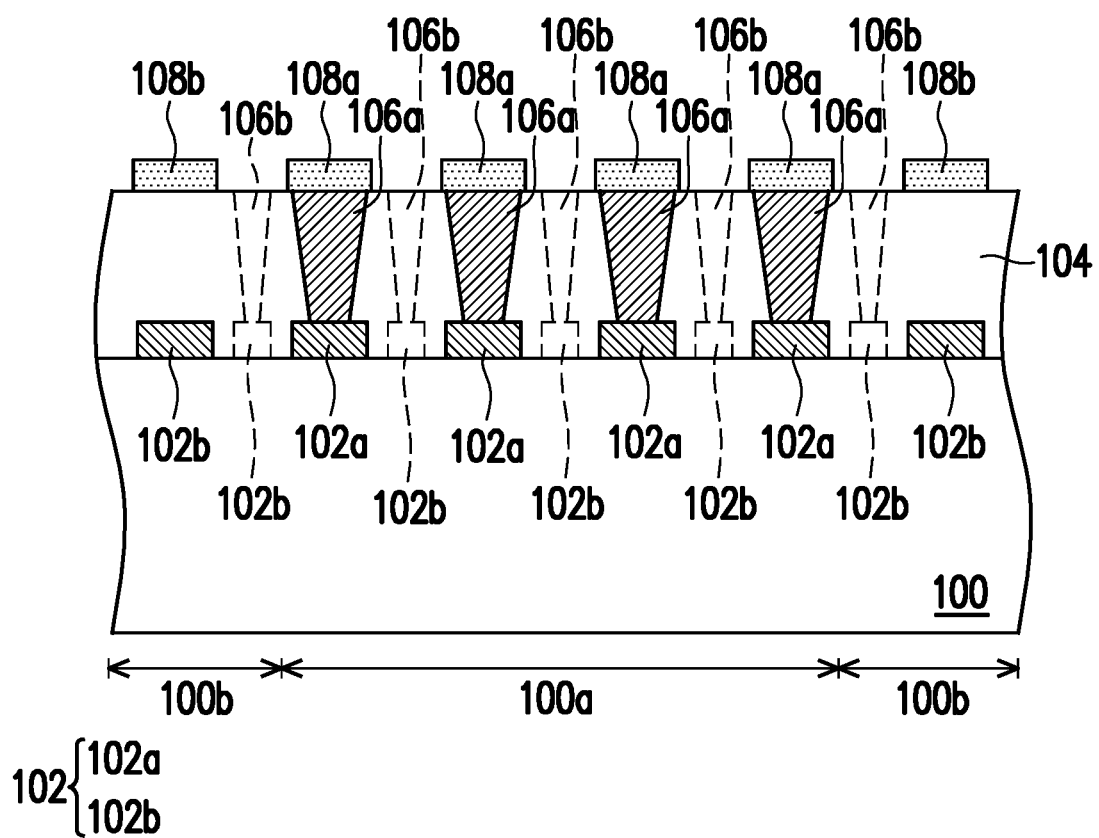
Figure 3A:
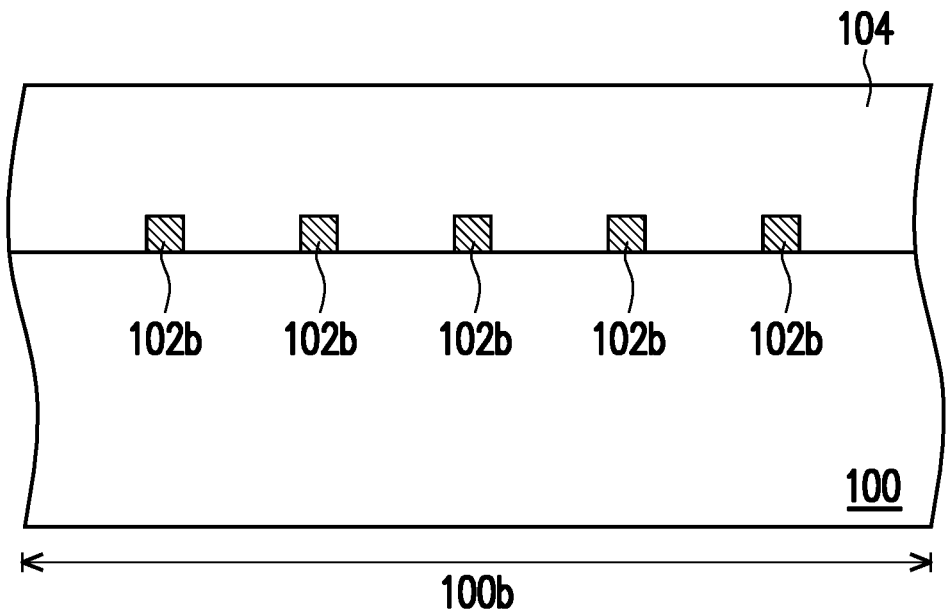
FIGS. 3A to 3C are schematic cross-sectional views of the manufacturing process according to the section line II-IT in FIGS. 1A to 1C.
Figure 3B:
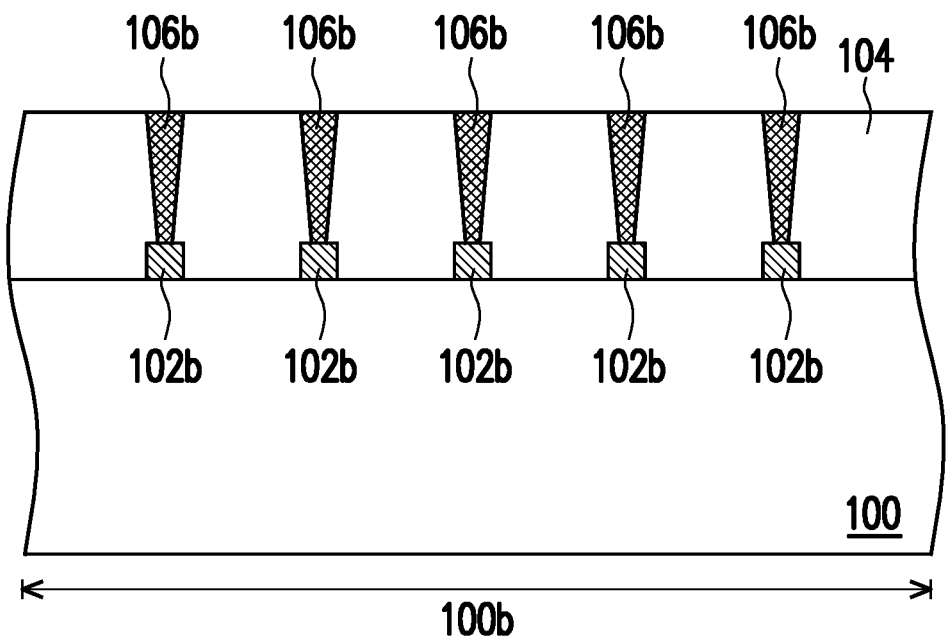
Figure 3C:
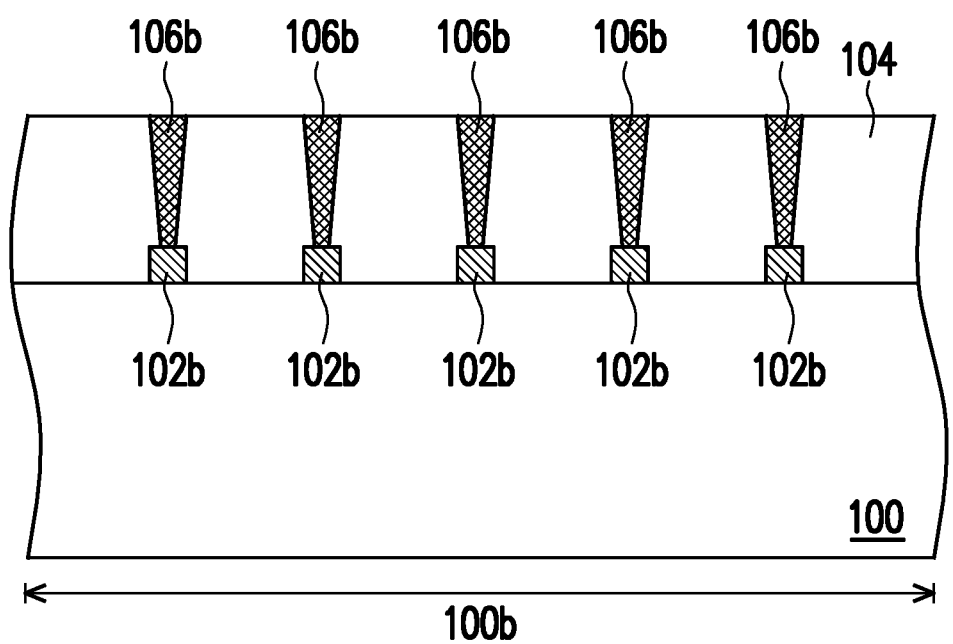

FIGS. 1A to 1C are schematic top views of a manufacturing process of the non-volatile memory device according to an embodiment of the present invention. FIGS. 2A to 2C are schematic cross-sectional views of the manufacturing process according to the section line I-I' in FIGS. 1A to 1C. FIGS. 3A to 3C are schematic cross-sectional views of the manufacturing process according to the section line II-IT in FIGS. 1A to 1C.

Referring to FIGS. 1A, 2A and 3A, a substrate 100 is provided. The substrate 100 has a memory region 100a and a dummy region 100b surrounding the memory region 100a. The memory region 100a is a region where memory cells are disposed. The memory cells may be memory cells of a magnetoresistive random access memory or other types of memory, which is not limited in the present invention. The dummy region 100b is a region where dummy devices that are not electrically connected to the memory cells. In the present embodiment, the substrate 100 is a silicon substrate on which various semiconductor devices have been formed. For example, the substrate 100 may include a silicon substrate, a transistor formed on the surface of the silicon substrate and a dielectric layer covering the transistor, but the present invention is not limited thereto. Then, an interconnect structure 102 is formed in the dielectric layer. In the present embodiment, in order to make the drawings clear and easy to explain, the above-mentioned various semiconductor devices are not drawn, and only the uppermost circuit layer in the interconnect structure 102 is drawn. The circuit layer may be located in the dielectric layer or on the surface of the dielectric layer according to actual needs. The interconnect structure 102 is electrically connected to the semiconductor devices on the silicon substrate. Then, a dielectric layer 104 is formed on the substrate 100 to cover the interconnect structure 102. The forming methods of the above-mentioned various semiconductor devices and interconnect structure 102 are well known to those skilled in the art, and will not be described here.

In the present embodiment, the interconnect structure 102 includes main portions 102a located in the memory region 100a as electrical connection members and dummy portions 102b located in the dummy region 100b not as electrical connection members, but the present invention is not limited thereto. In other embodiments, depending on actual layout requirements, the interconnect structure 102 may only include the main portions 102a located in the memory region 100a.

Referring to FIGS. 1B, 2B and 3B, a plurality of vias are formed in the dielectric layer 104. The forming method of the vias is well known to those skilled in the art, and will not be described here. In detail, in the present embodiment, conductive vias 106a are formed in the dielectric layer 104 in the memory region 100a, and dummy vias 106b are formed in the dielectric layer 104 in the dummy region 100b. The dummy vias 106b surround the conductive vias 106a in the memory region 100a. In the present embodiment, the conductive vias 106a are connected to the main portions 102a of the interconnect structure 102, and the dummy vias 106b are connected to the dummy portions 102b of the interconnect structure 102. In this way, the conductive vias 106a may be used as electrical connection members, while the dummy vias 106b may not be used as electrical connection members. In other embodiments, the dummy vias 106b may not be connected to the dummy portions 102b of the interconnect structure 102.

In the present embodiment, from a top view, the conductive vias 106a are arranged in an array. In the array, the conductive vias 106a in two adjacent columns are aligned with each other, and the conductive vias 106a in two adjacent rows are aligned with each other. That is, in the present embodiment, the conductive vias 106a in the memory region 100a are arranged in a rectangular array, and the dummy vias 106b surround the conductive vias 106a arranged in the rectangular array. In addition, from the top view, the dummy vias 106b are not aligned with the conductive vias 106a in the column direction, and are not aligned with the conductive vias 106a in the row direction. In addition, the distance D1 between the conductive vias 106a in two adjacent columns is less than the distance D3 between the adjacent dummy via 106b and the conductive via 106a, and the distance D2 between the conductive vias 106a in two adjacent rows is also less than distance D3.

Based on the above layout, during the formation of the conductive vias 106a and the dummy vias 106b, when defining the positions of the conductive vias 106a and the dummy vias 106b by the photolithographic process, only the profile of the photoresist pattern used to define the positions of the dummy vias 106b may be affected by the optical effect, so that the dummy vias 106b have a smaller aperture. The profile of the photoresist pattern used to define the positions of the conductive vias 106a surrounded by the dummy vias 106b may not be affected by the optical effect. Therefore, all of the conductive vias 106a in the memory region 100a may have the same aperture to ensure that the performance of the memory device is not affected. In addition, since the dummy vias 106b are not used as electrical connection members, even if the dummy vias 106b have uneven apertures and/or reduced apertures, the performance of the memory device may not be affected. For example, when the memory device to be formed is a magnetoresistive random access memory, since all of the conductive vias 106a in the memory region 100a have the same and not reduced aperture, the resistance of the conductive vias 106a may be avoided being too large and uneven, which may prevent the tunneling magnetoresistance of the magnetoresistive random access memory from being greatly reduced.

Referring to FIGS. 1C, 2C and 3C, memory cells 108 are formed on the dielectric layer 104 to form a non-volatile memory device 10 of the present embodiment. The memory cells 108 may be memory cells of a magnetoresistive random access memory or other types of memory, which is not limited in the present invention. The forming method of the memory cells 108 is well known to those skilled in the art, and will not be described here. Based on the arrangement of the conductive vias 106a, from the top view, the memory cells 108 are arranged in an array. In detail, the memory cells 108 include first memory cells 108a located in the memory region 100a and second memory cells 108b located in the dummy region 100b. Each of the first memory cells 108a is formed above the corresponding conductive via 106a and is connected to the corresponding conductive via 106a. In other words, one conductive via 106a is located between the corresponding first memory cell 100a and the interconnect structure 102 to electrically connected the corresponding first memory cell 100a to the interconnect structure 102. The second memory cells 108b are formed on the dielectric layer 104 in the dummy region 100b, and is not connected to the dummy vias 106b. Therefore, the second memory cells 108b may be regarded as dummy memory cells.

Since the second memory cells 108b are formed to surround the first memory cells 108a, during the formation of the first memory cells 108a and the second memory cells 108b, when defining the positions of the first memory cells 108a and the second memory cells 108b by the photolithographic process, only the profile of the photoresist pattern used to define the positions of the second memory cells 108b may be affected by the optical effect, so that the second memory cells 108b has a smaller dimension. The profile of the photoresist pattern used to define the positions of the first memory cells 108a surrounded by the second memory cells 108b may not be affected by the optical effect. Therefore, all of the first memory cells 108a in the memory region 100a may have the same dimension to ensure that the performance of the memory device is not affected. In addition, since the second memory cells 108b are dummy memory cells, even if the second memory cells 108b have uneven dimensions and/or reduced dimensions, the performance of the memory device may not be affected.

In addition, in the dummy region 100b, since the second memory cells 108b are not connected to the dummy vias 106b, the second memory cells 108b may not be electrically connected to the interconnect structure 102, and thus may not affect the operation of the first memory cells 108a in the memory region 100a.

Figure 4:
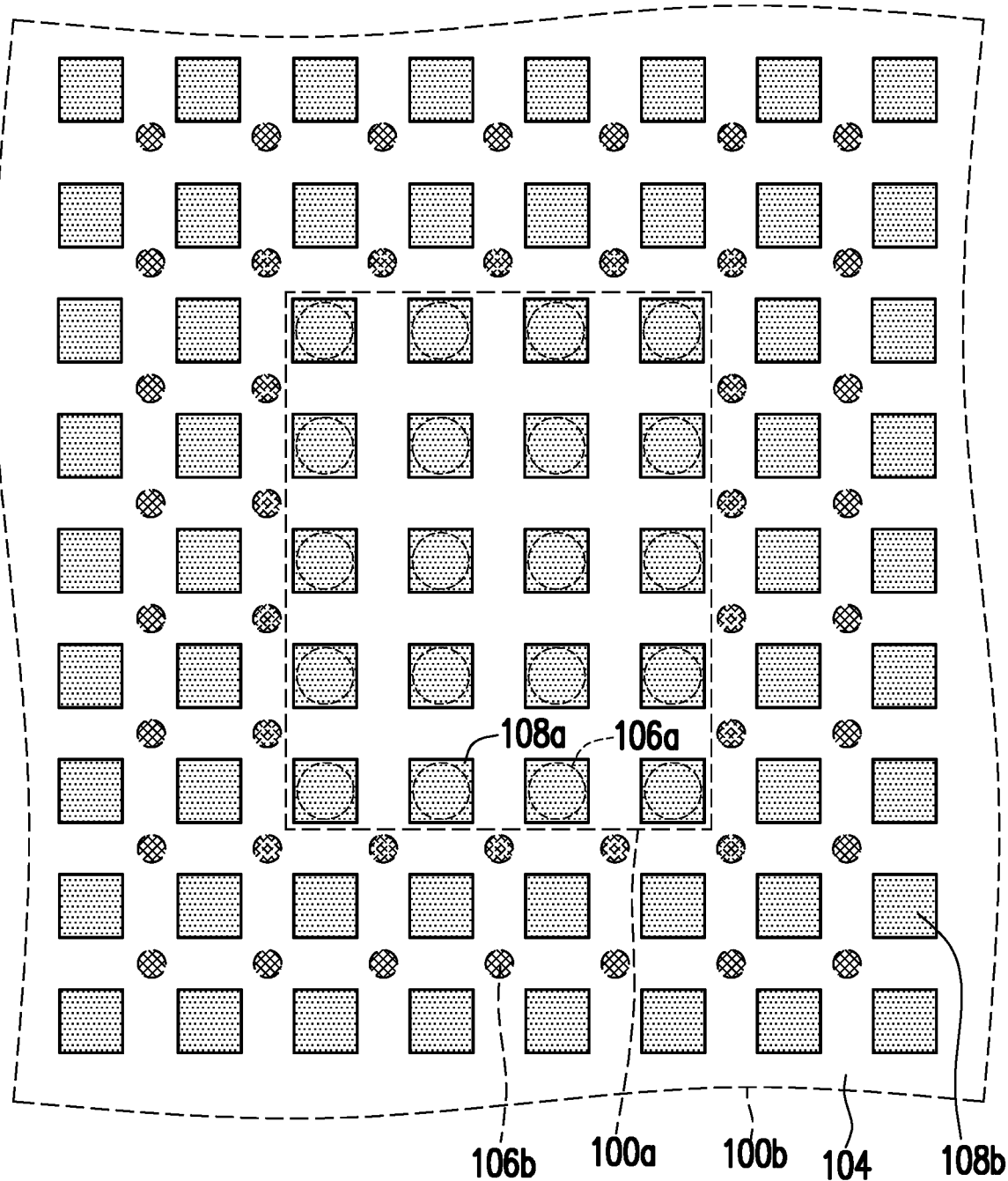
FIG. 4 is a schematic top view of a non-volatile memory device according to another embodiment of the present invention.

In the present embodiment, from the top view, as shown in FIG. 1C, one circle of second memory cells 108b surrounds the memory region 100a, and the dummy vias 106b are located between the second memory cells 108b and the first memory cells 108a to surround the first memory cells 108a, but the present invention is not limited thereto. In other embodiment, from the top view, a plurality of circles of the second memory cells 108b may be disposed around the memory region 100a, and the dummy vias 106b may be located between two adjacent circles of second memory cells 108b, in addition to being located between the second memory cells 108b and the first memory cells 108a, as shown in FIG. 4.

Figure 5:
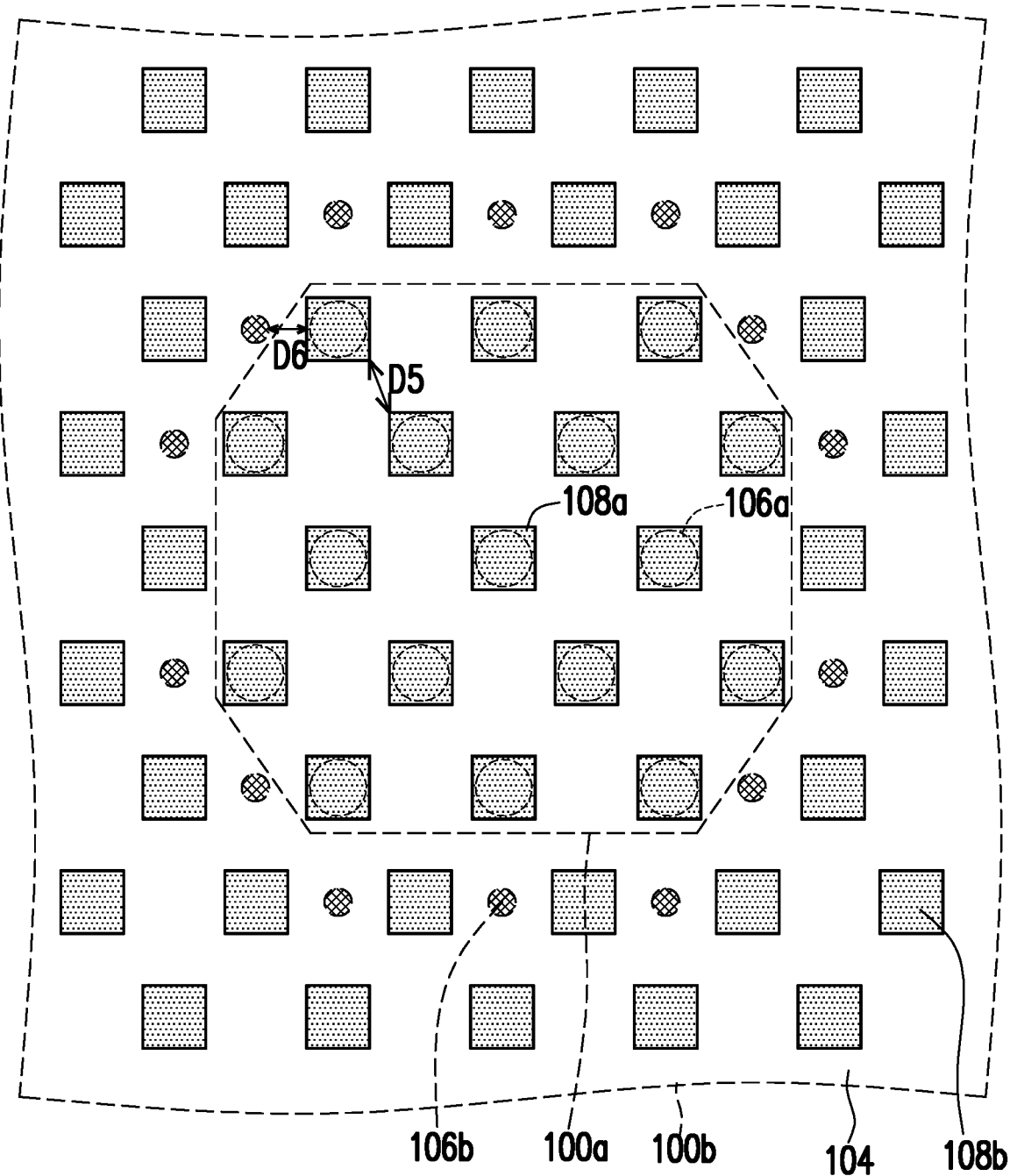
FIG. 5 is a schematic top view of a non-volatile memory device according to another embodiment of the present invention.

FIG. 5 is a schematic top view of a non-volatile memory device according to another embodiment of the present invention. In the present embodiment, the device that is the same as the device in FIG. 1C will be represented by the same reference number and will not be described again. In addition, the manufacturing process of the non-volatile memory device of the present embodiment is the same as the manufacturing process described in FIGS. 1A to 1C, and will not be described again.

Referring to FIG. 5, in the present embodiment, from a top view, in the memory region 100a, the conductive vias 106a in two adjacent columns are not aligned with each other, and the conductive vias 106a in two adjacent rows are not aligned with each other. That is, in the present embodiment, the conductive vias 106a in the memory region 100a are arranged in an approximately octagonal array, and the dummy vias 106b surround the conductive vias 106a that are arranged in an approximately octagonal array. In addition, the distance D5 between the conductive vias 106a in two adjacent columns and in two adjacent rows is greater than the distance D6 between the adjacent dummy via 106b and the conductive via 106a.

Based on the above layout, during the formation of the conductive vias 106a and the dummy vias 106b, when defining the positions of the conductive vias 106a and the dummy vias 106b by the photolithographic process, only the profile of the photoresist pattern used to define the positions of the dummy vias 106b may be affected by the optical effect, so that the dummy vias 106b have a smaller aperture. The profile of the photoresist pattern used to define the positions of the conductive vias 106a surrounded by the dummy vias 106b may not be affected by the optical effect. Therefore, all of the conductive vias 106a in the memory region 100a may have the same aperture to ensure that the performance of the memory device is not affected. In addition, since the dummy vias 106b are not used as electrical connection members, even if the dummy vias 106b have uneven apertures and/or reduced apertures, the performance of the memory device may not be affected. For example, when the memory device to be formed is a magnetoresistive random access memory, since all of the conductive vias 106a in the memory region 100a have the same and not reduced aperture, the resistance of the conductive vias 106a may be avoided being too large and uneven, which may prevent the tunneling magnetoresistance of the magnetoresistive random access memory from being greatly reduced.

In addition, since the second memory cells 108b are formed to surround the first memory cells 108a, during the formation of the first memory cells 108a and the second memory cells 108b, when defining the positions of the first memory cells 108a and the second memory cells 108b by the photolithographic process, only the profile of the photoresist pattern used to define the positions of the second memory cells 108b may be affected by the optical effect, so that the second memory cells 108b has a smaller dimension. The profile of the photoresist pattern used to define the positions of the first memory cells 108a surrounded by the second memory cells 108b may not be affected by the optical effect. Therefore, all of the first memory cells 108a in the memory region 100a may have the same dimension to ensure that the performance of the memory device is not affected. In addition, since the second memory cells 108b are dummy memory cells, even if the second memory cells 108b have uneven dimensions and/or reduced dimensions, the performance of the memory device may not be affected.

In addition, as mentioned above, in other embodiments, from the top view, a plurality of circles of the second memory cells 108b may be disposed around the memory region 100a, and the dummy vias 106b may be located between two adjacent circles of second memory cells 108b, in addition to being located between the second memory cells 108b and the first memory cells 108a.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A non-volatile memory device, comprising:
a substrate, having a memory region and a dummy region surrounding the memory region;
an interconnect structure, disposed on the substrate and located in the memory region;
a plurality of memory cells, disposed on the interconnect structure and arranged in an array when viewed from a top view, wherein the plurality of memory cells comprises a plurality of first memory cells located in the memory region and a plurality of circles of second memory cells located in the dummy region;
a plurality of conductive vias, disposed in the memory region and located between the plurality of first memory cells and the interconnect structure to electrically connect each of the first memory cells and the interconnect structure, respectively; and
a plurality of circles of dummy vias, disposed in the dummy region and surrounding the memory region, wherein one of the plurality of circles of dummy vias is located between two adjacent circles of second memory cells, and one of the plurality of circles of dummy vias is located between the second memory cells and the first memory cells,
wherein the aperture of the dummy vias is smaller than the aperture of the conductive vias.

2. The non-volatile memory device of claim 1, wherein when viewed from a top view, the conductive vias in two adjacent columns are aligned with each other, and the conductive vias in two adjacent rows are aligned with each other.

3. The non-volatile memory device of claim 2, wherein when viewed from a top view, the plurality of circles of dummy vias are not aligned with the plurality of conductive vias in the column direction, and the plurality of circles of dummy vias are not aligned with the plurality of conductive vias in the row direction.

4. The non-volatile memory device of claim 3, wherein the distances between the conductive vias in two adjacent columns and between the conductive vias in two adjacent rows are smaller than the distance between the adjacent dummy via and the conductive via.

5. The non-volatile memory device of claim 1, wherein when viewed from a top view, the conductive vias in two adjacent columns are not aligned with each other, and the conductive vias in two adjacent rows are not aligned with each other.

6. The non-volatile memory device of claim 5, wherein the distances between the conductive vias in two adjacent columns and between the conductive vias in two adjacent rows are greater than the distance between the adjacent dummy via and the conductive via.

7. The non-volatile memory device of claim 1, wherein the interconnect structure comprises dummy portions located in the dummy region, and the plurality of circles of second memory cells are not electrically connected to the dummy portions.

8. The non-volatile memory device of claim 7, wherein the plurality of circles of dummy vias are not connected to the dummy portions.

9. The non-volatile memory device of claim 7, wherein the plurality of circles of dummy vias are connected with the dummy portions.

10. A manufacturing method of a non-volatile memory device, comprising:
   providing a substrate having a memory region and a dummy region surrounding the memory region;
   forming an interconnect structure on the substrate, wherein the interconnect structure is located in the memory region;
   forming a plurality of memory cells on the interconnect structure, wherein the plurality of memory cells are arranged in an array when viewed from a top view, and comprise a plurality of first memory cells located in the memory region and a plurality of circles of second memory cells located in the dummy region;
   forming a plurality of conductive vias in the memory region, wherein the plurality of conductive vias are located between the plurality of first memory cells and the interconnect structure to electrically connect each of the first memory cells and the interconnect structure, respectively; and
   forming a plurality of circles of dummy vias in the dummy region, wherein the plurality of circles of dummy vias surround the memory region, wherein one of the plurality of circles of dummy vias is located between two adjacent circles of second memory cells, and one of the plurality of circles of dummy vias is located between the second memory cells and the first memory cells,
   wherein the aperture of the dummy vias is smaller than the aperture of the conductive vias.

11. The manufacturing method of a non-volatile memory device of claim 10, wherein when viewed from a top view, the conductive vias in two adjacent columns are aligned with each other, and the conductive vias in two adjacent rows are aligned with each other.

12. The manufacturing method of a non-volatile memory device of claim 11, wherein when viewed from a top view, the plurality of circles of dummy vias are not aligned with the plurality of conductive vias in the column direction, and the plurality of circles of dummy vias are not aligned with the plurality of conductive vias in the row direction.

13. The manufacturing method of a non-volatile memory device of claim 12, wherein the distances between the conductive vias in two adjacent columns and between the conductive vias in two adjacent rows are smaller than the distance between the adjacent dummy via and the conductive via.

14. The manufacturing method of a non-volatile memory device of claim 10, wherein when viewed from a top view, the conductive vias in two adjacent columns are not aligned with each other, and the conductive vias in two adjacent rows are not aligned with each other.

15. The manufacturing method of a non-volatile memory device of claim 14, wherein the distances between the conductive vias in two adjacent columns and between the conductive vias in two adjacent rows are greater than the distance between the adjacent dummy via and the conductive via.

16. The manufacturing method of a non-volatile memory device of claim 10, wherein the interconnect structure comprises dummy portions located in the dummy region, and the plurality of circles of second memory cells are not electrically connected to the dummy portions.

17. The manufacturing method of a non-volatile memory device of claim 16, wherein the plurality of circles of dummy vias are not connected to the dummy portions.

18. The manufacturing method of a non-volatile memory device of claim 16, wherein the plurality of circles of dummy vias are connected with the dummy portions.

* * * * *